United States Patent [19]

Carlson

[11] Patent Number: 4,878,022
[45] Date of Patent: Oct. 31, 1989

[54] WIDENED AND SHAPED MRI SURFACE COIL HAVING INCREASED SIGNAL-TO-NOISE RATIO

[75] Inventor: Joseph W. Carlson, Kensington, Calif.

[73] Assignee: The Regents of the University of California, Berkeley, Calif.

[21] Appl. No.: 257,801

[22] Filed: Oct. 14, 1988

[51] Int. Cl.$^4$ ............................................. G01R 33/20
[52] U.S. Cl. ..................................... 324/318; 324/322
[58] Field of Search ............... 324/300, 307, 309, 318, 324/322; 128/653

[56] References Cited

U.S. PATENT DOCUMENTS

| | | | |
|---|---|---|---|
| 4,620,155 | 10/1986 | Edelstein | 324/318 |
| 4,636,730 | 1/1987 | Bottomley | 324/318 |
| 4,672,972 | 6/1987 | Berke | 324/318 |
| 4,703,274 | 10/1987 | Kaufman | 324/309 |
| 4,739,269 | 4/1988 | Kopp | 324/318 |
| 4,774,468 | 9/1988 | Bydder | 324/318 |
| 4,775,837 | 10/1988 | Roschmann | 324/318 |
| 4,777,438 | 10/1988 | Holland | 324/318 |
| 4,791,371 | 12/1988 | Krol | 324/318 |

OTHER PUBLICATIONS

Carlson, "Currents and Fields of Thin Conductors in rf Saddle Coils", Mag. Res. In. Med., vol. 3, pp. 778-790 (1986).

*Primary Examiner*—Michael J. Tokar
*Attorney, Agent, or Firm*—Nixon & Vanderhye

[57] ABSTRACT

The signal-to-noise ratio achievable for received nuclear magnetic resonance RF signals in a magnetic resonance imaging system is increased by (a) using relatively wider strips of conductor so as to reduce coil loading by the sample and (b) the use of curved edges on a coil conductor so as to reduce "hot spots" located near the conductor surfaces.

10 Claims, 3 Drawing Sheets

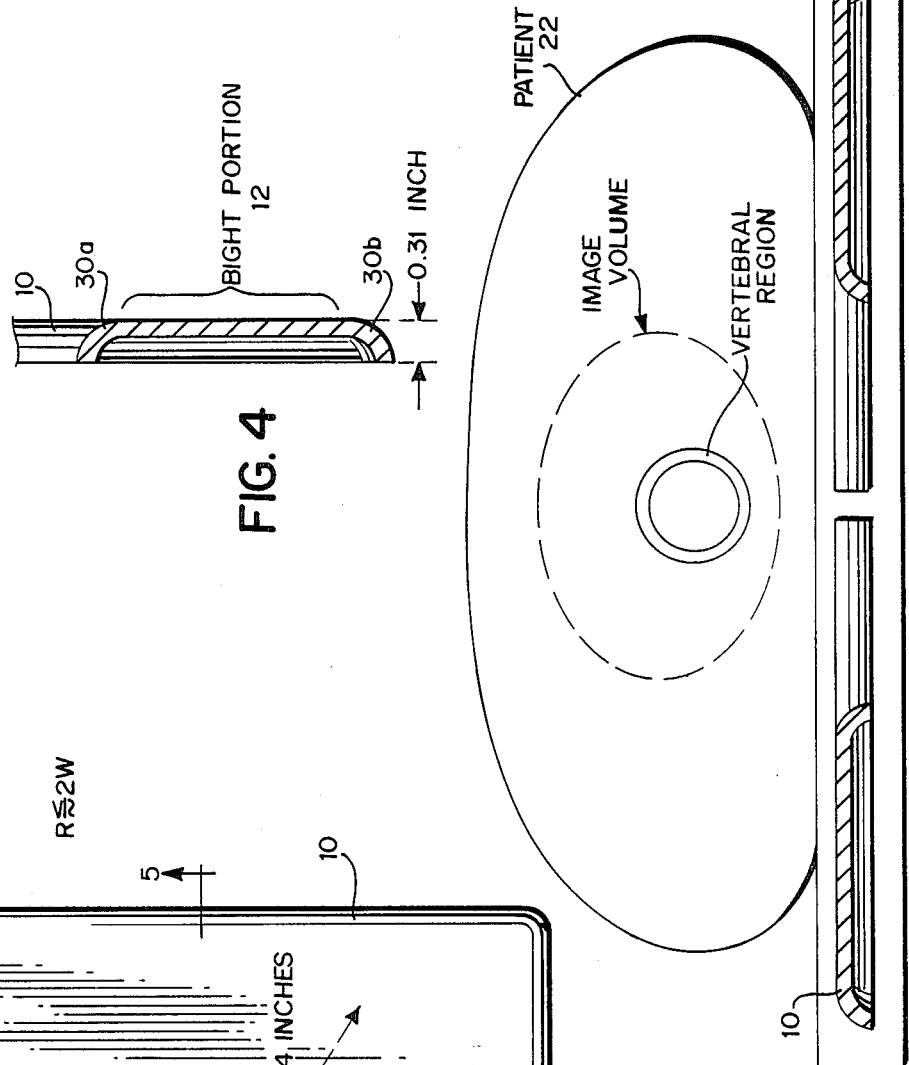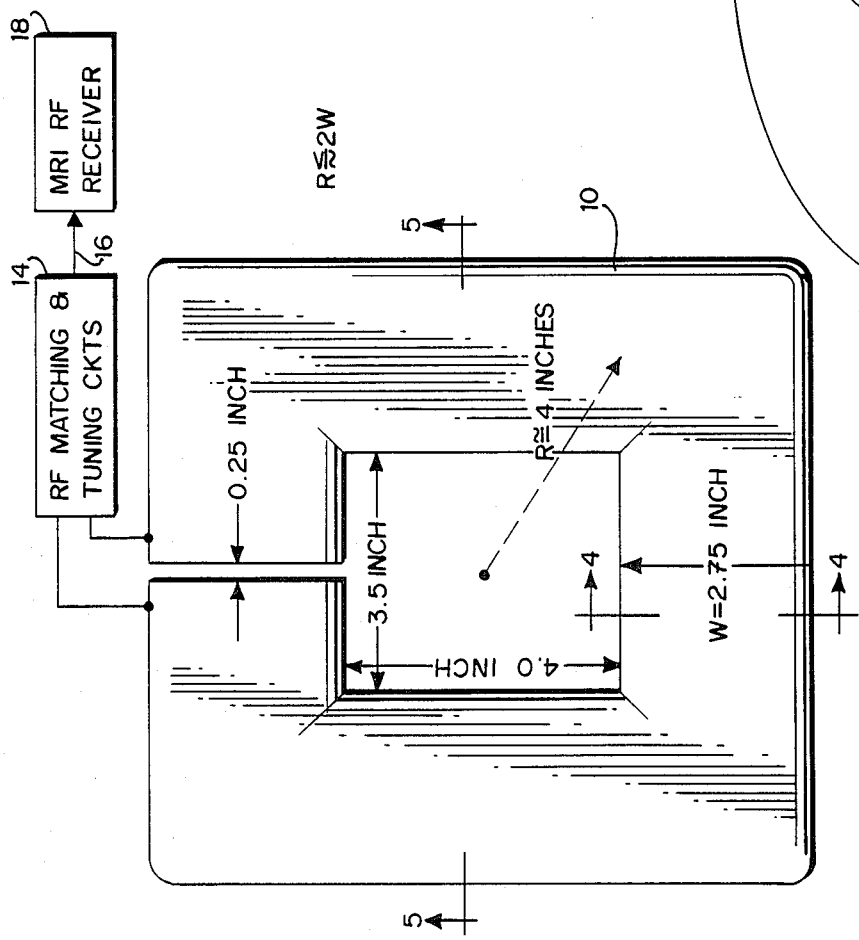

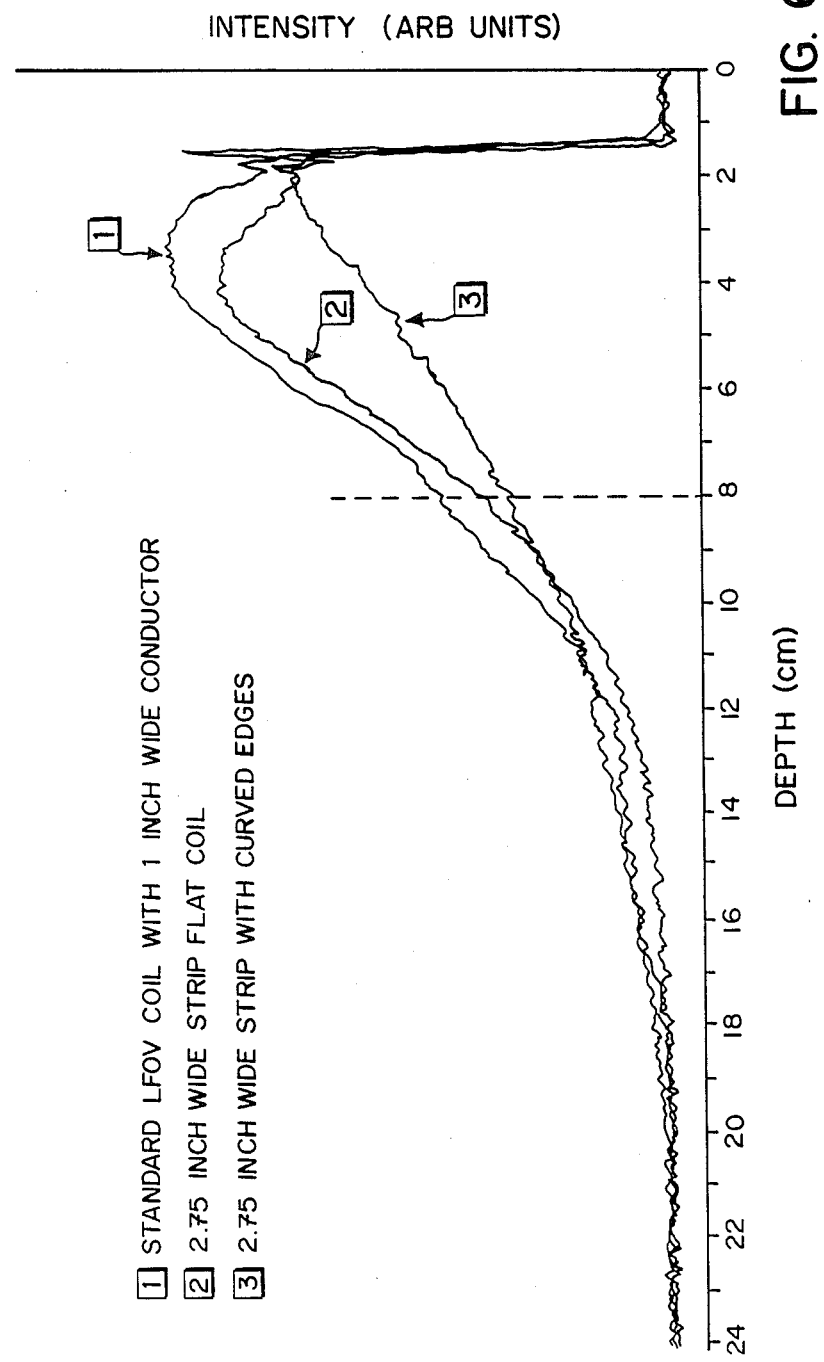

WIDENED AND SHAPED MRI SURFACE COIL HAVING INCREASED SIGNAL-TO-NOISE RATIO

This invention is generally related to the field of magnetic resonance imaging (MRI) utilizing nuclear magnetic resonance (NMR) phenomena. In particular, it is directed to an improved RF coil structure for use in such an MRI system.

Magnetic resonance imaging systems of various types are now available commercially and widely used in the medical community for non-evasive medical imaging purposes. In brief summary, by utilizing a carefully controlled sequence of magnetic gradient pulses and shaped and timed RF pulses, radio frequency NMR responses are generated from within a patient image volume. By properly collecting and analyzing sufficient of these relatively weak RF responses, sufficient information can be gathered to generate and display a cross-sectional image representing the spatial distribution of NMR nuclei within given "slices" or other desired regions of the patient image volume.

A wide variety of different RF coil structures have been utilized in the past for efficiently coupling RF signals to/from the patient image volume. Some of these coils totally encircle the body part to be imaged while others are so-called "surface" coils located tangential to the patient body and approximately centered upon an internal desired image volume. Typically, such surface coils may be utilized only for RF signal reception (other RF coils being used for RF transmissions into the patient volume).

A variety of different types of surface coils have also been proposed and used in the past. See, for example, a copending commonly assigned U.S. Pat. application Ser. No. 145,279 filed Jan. 19, 1988 naming Kaufman et al as inventors for some of the already known advantages of surface RF coils for magnetic resonance imaging in certain circumstances.

Since image quality is directly related to achievable signal-to-noise ratio associated with the received RF signals, those in the art always seek to improve the available signal-to-noise ratio. This is particularly so for coils used to image the lumbar spine vertebral region of the human body where additional image quality is often desired to improve diagnostic capabilities.

I have discovered that by making an MRI RF coil conductive element of relatively widened and shaped dimensions, the effective signal-to-noise ratio of received RF signals can be enhanced. This invention is particularly suitable for use in surface coil constructions used for imaging the vertebral regions of the human body.

In the presently preferred exemplary embodiment, the conductive element is formed with a relatively wide flat portion directed towards the patient image volume and with associated shaped edges which curve away from this flat portion and away from the patient image volume.

In the exemplary embodiment, the result is a conductive element having a shallow generally U-shaped cross-section. A substantially flat bight portion with curved, relatively small radius, lips project from either side at a 90° orientation away from the proximal flat bight portion of the conductor.

Preferably, the width of the conductor cross-section is approximately one-half (or less) the average radius of the surface coil loop. The result is a relatively small central aperture in the loop. Both this relatively wide conductor (compared to the average radius of the surface coil loop) and the curved-away shaped edges are believed to contribute to improved signal-to-noise ratio.

These and other objects and advantages of this invention will be more completely understood and appreciated by carefully studying the following detailed description of a presently preferred exemplary embodiment of this invention, taken in conjunction with the accompanying drawings, of which:

FIG. 3 is a plan view of presently preferred exemplary embodiment of this invention;

FIGS. 4 and 5 are cross-sectional depictions of the conductor element shown in FIG. 3, and;

FIG. 6 is a graph illustrating exemplary signal-to-noise ratio improvements that have been obtained with the exemplary embodiment.

Figures 1, 2:
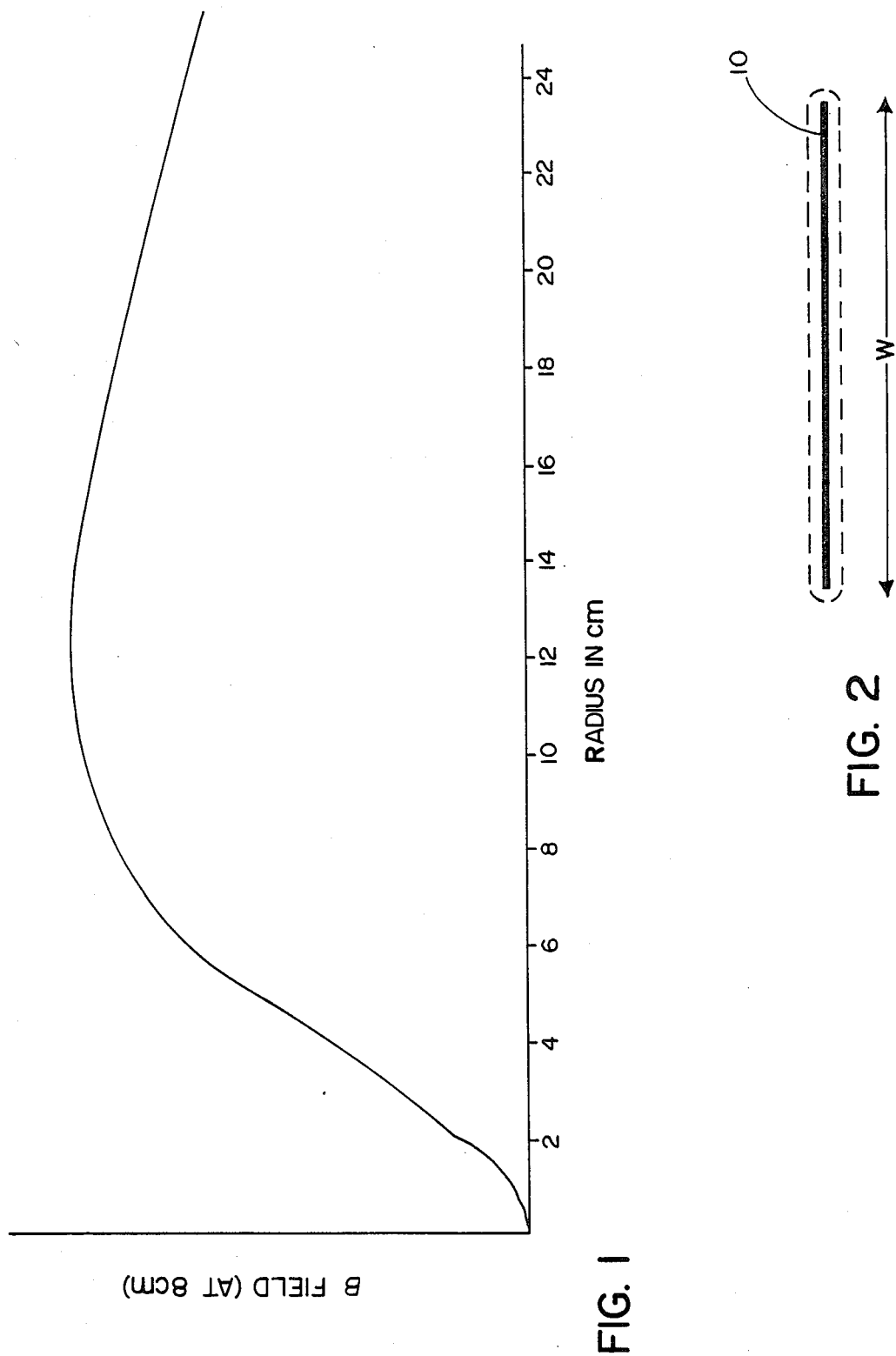
FIG. 1 is a plot of magnetic field at a location about eight centimeters from the center of a circular loop of radius R and is useful in explaining this invention.
FIG. 2 is a cross-sectional depiction of a wide conductor of width W which is also useful in explaining this invention.

As can be understood by the reciprocity theorem, the signal-to-noise ratio associated with a certain location relative to a surface coil RF receiver may be calculated knowing (a) the strength of the magnetic field at that point, and (b) the power dissipated by the coil when it is used as a transmitter. In particular, the signal-to-noise ratio is proportional to:

$$S/NB = T\bar{B}|\sqrt{P}. \qquad \text{(Equation 1)}$$

This can be rewritten by replacing the dissipated power by the effective series resistance of the coil in an electrical circuit and the magnetic field generated by the coil for a unit amount of current flowing within it. Since $P = I^2 R$, this is simply:

$$S/N = B/\sqrt{R}. \qquad \text{(Equation 2)}$$

Although these parameters are all assumed to have been measured when the coil is used as an RF transmitter, it is here not being considered as a transmitter, but, rather, as a surface coil receiver. However, because this analysis makes use of the reciprocity theorem, the hypothetical field thus generated by the coil will be considered and understood as representing a hypothetical measurement of quantities that contribute to this signal-to-noise ratio.

Typically, the current carrying path of a surface coil is a single loop. Therefore, one may consider it as being simply a juxtaposition of many fine wire loops (circular or square or rectangular or the like) of conductive wires. The size and shape of the loop are typically determined by the transverse distance (i.e., depth) to the desired patient image volume and the desired size of a field of view. One generally accepted "rule of thumb" is that one should use a loop (e.g., circular or square) with a radius (or average radius) approximately equal to the depth of the patient image volume with respect to the plane of the coil.

In typical human patients, vertebrae are located about eight centimeters from the outside surface of the patient's back. Especially for a large field of view, a surface coil may actually have a much larger radius. For example, one such large field of view surface coil uses an essentially square loop dimensioned approximately 20 centimeters on each side. (Reference may also be had to the above referenced related copending commonly assigned application Ser. No. 145,279.)

Such simple surface coil loops do not appear to offer many variables for improving the available signal-to-noise ratio. For example, the magnetic field magnitude at a given location is relatively insensitive (over a relatively large area) to the radius of the surface coil loop. The magnetic field strength for a location at eight centimeters from the center of a circular loop of radius R is plotted in FIG. 1. From this plot, it can be seen that although a maximum occurs at approximately R=11.3 centimeters, the peak is very very broad. Thus, changing the radius R from 7.7 centimeters to 17.2 centimeters only changes the magnetic field strength by about 10 percent.

Since changing the radius of the coil by itself does not produce dramatic changes in the magnetic field strength, the above equations suggest that one might achieve improved signal-to-noise and noise ratios if one could somehow reduce the power effectively absorbed by the coil (as loaded by the patient mass). Although the coil itself already is constructed so as to absorb as little power as possible, I have discovered that there is room for improvement if the coil can be constructed so as to reduce the amount of power effectively dissipated in unwanted portions of the patient volume.

The amount of power dissipated within a given patient sub-volume depends upon many factors. For example, the shape and size of the patient mass itself as well as its own local conductivity all play a role. However, one factor which I have discovered it possible to control is the magnitude of the local RF magnetic field in regions of the body that are typically of no imaging interest. For example, one problem with surface coils is that the RF magnetic field located closest to the coil is the most intense. However, this is a region that is usually not of great interest because subcutaneous fat has very little diagnostic value.

In short, this invention provides a novel coil structure which provides enhanced signal-to-noise ratio. It is presently believed that such improvements in the signal-to-noise ratio may be caused by coil structure which effectively reduce the RF magnetic field strength at locations closest to the coil while yet maintaining the desired RF magnetic field strength within a desired patient image volume located at some considerable transverse distance from the coil (e.g., 8 centimeters in the case of human vertebrae).

Although some surface coils have been constructed using relatively wide (e.g., 3 inch strips of copper conductor (e.g., see the above referenced related copending commonly assigned U.S. application Ser. No. 145,279), MRI RF surface coils typically have been made with much narrower conductors (e.g., one inch wide copper strips or copper tubing of various diameters).

Current flowing along a relatively wide strip distributes itself within that strip in a complex manner. However, if some current distribution is assumed, then the resulting magnetic field can be calculated by treating the wide strip as a super-position of many different loops, each having a respectively different current in accordance with the assumed distribution. However, as already noted with respect to FIG. 1, when fields at transverse distances of 8 centimeters are considered, loop radiuses of from 7.7 centimeters to 17.2 centimeters do not change the magnetic field by more than about 10%. Accordingly, no matter what current distribution is assumed, the magnetic field at 8 centimeters transverse to a loop or radius 11.3 centimeters is not more than 10% different from a wide strip loop having an inner radius of 7.7 centimeters and an outer radius of 17.2 centimeters.

However, when the field situated close to the conductor surface is considered, the width does become a more important factor. For example, an estimate of the mean magnetic field strength located close to the conductor can be derived by using Ampere's Law. A cross-section of a relatively wide conductor (of width W) is depicted at FIG. 2 (i.e., with current passing perpendicular to the plane of FIG. 2). By Ampere's Law, the line integral of the magnetic field along the dotted path shown in FIG. 2 must be proportional to the current flowing down the conductor. The magnetic field vector is also disposed tangentially to the dotted path. This gives as mean value of the magnetic field:

$$B_{av} = \mu_0 I / 2w \quad \text{(Equation 3)}$$

Accordingly, as the width W is made larger, the mean magnetic field value located close to the coil conductor surface decreases.

To test this theory, I have constructed several coils and loaded with them a standardized saline sample. By measuring standard circuit parameters (e.g., Q, inductance and resonant frequency), the effective series resistance added to the coil by the saline can be calculated. For one coil using one inch wide copper strip as the conductive member, the series resistance added by the saline load was 1.14 ohm. However, by widening the strips from one inch to 2.75 inches and by maintaining a relatively small radius (e.g., a rectangle having outside dimensions of 9 by 9.5 inches and inside dimensions of 3.5 by 4 inches), the effective series resistance added by the same saline load was only 0.43 ohms. Accordingly, by using a loop conductor having a width which is on the order of half (or more) the average radius, the series resistance effectively added to the coil by the saline load is decreased by nearly a factor of three.

Although the current distribution on a wide flat strip of conductor is a difficult problem to solve analytically, some special cases can be solved and are described in my published article at *Magnetic Resonance in Medicine*, Volume 3, pp 778–790 (1986). In general, the current density can be expected to be peaked near the edges of a wide flat copper conductor.

Such regions of peak current densities are also regions where RF magnetic field intensity can be expected to peak. Accordingly, still further improvement in signal-to-noise ratio may be achieved by effectively moving the edges of such relatively wide flat strips away from the patient image volume. In the exemplary embodiment, the edges of the strip are rolled away from the patient image volume by about a one-fourth inch magnitude and radius. This has been observed to increase the signal-to-noise ratio by about another 20% over designs without such curved edges.

The previously described exemplary embodiment is depicted at FIGS. 3–5. Here, the conductor 10 includes a relatively flat bight portion 12 which is shaped into a single rectangular loop (of exemplary dimensions as shown in FIG. 3) and in a plane generally parallel to the substantially flat bight portion 12.

As will be appreciated by those in the art, the conductive loop 10 is connected to conventional RF matching and tuning circuits 14 and via RF transmission line 16 to conventional MRI RF receiver circuits 18 within a magnetic resonance imaging system. The actual conductive element 10 may typically be embedded within a housing 20 (e.g., non-magnetic, insulating potting compound, plastics, etc.) and possibly shaped in its external portions for comfort of a patient 22 in which the image volume 24 is present around a vertebral region 26 generally centered over the coil structure.

As indicated in FIG. 3, the average radius of the coil 10 is on the order of only twice (or less) the width of conductor 10 so as to create an overall coil structure having a relatively small central aperture.

It will also be noted in the FIGS. that at both edges of the bight portion 12, a curved shaped section 30a, 30b is provided so as to move the high intensity current distributions at the edges of the flat conductor 10 further away from the patient body 22.

The noted increase in signal-to-noise ratio at eight centimeters transverse distance from the coil in the exemplary embodiment is about 35% over other available coil structures (e.g., those not having the previously described relatively wide (compared to the radius) conductors with curved edge portions). At a ten centimeter transverse distance, the improvement with the exemplary embodiment is only about 12% and at a thirteen centimeter transverse distance the improvement is only about 8%. It should also be noted that the improvement may differ from one patient to the next.

FIG. 6 is a graph of signal intensity for a saline phantom using three different coils: (1) a standard large field of view coil formed from 1" copper strip, (2) a surface coil formed from relatively wider (2.75 inch) flat copper strip without curved edges but otherwise of dimensions similar to the exemplary embodiment and (3) the preferred exemplary embodiment as shown in FIGS. 3–5 having not only a relatively wide 2.75 inch conductor (compared to the radius) but also curved edges. As will be seen, there is significant improvement (even at eight centimeters depth) when relatively wide (compared to radius) flat conductors are used and even greater improvement when the edges are curved as in the preferred exemplary embodiment.

Although only one exemplary embodiment has been described in detail, those skilled in the art will recognize that many variations and modifications may be made in this exemplary embodiment while still retaining many of the novel features and advantages of this invention. Accordingly, all such modifications and variations are intended to be included within the scope of the appended claims.

What is claimed is:

1. An MRI RF coil for use in a magnetic resonance imaging system and including:
    a conductive element for disposition with one side proximal an image area and another side distal thereto;
    said conductive element having a flat portion on the proximal side and associated edges which curve away from the proximal side toward said distal side.

2. An MRI RF coil for use in a magnetic resonance imaging system and including a single unitary conductor having a generally U-shaped cross-section.

3. An MRI RF coil for use in a magnetic resonance imaging system and including a conductive element having a generally U-shaped cross-section,
    wherein said cross-section includes a substantially flat bight portion with curved lips projecting from either side.

4. An RF coil as in claim 3 wherein said flat bight portion is of substantially more than one inch wide and said lips are formed with a radius of substantially less than one inch and wherein the edge of said lips extends at a 90° orientation from said bight portion.

5. An RF coil as in claim 4 wherein the lip radius is approximately 0.31 inch and the total distance between said lip edges measured parallel to said bight portion is approximately 2.75 inches.

6. An RF coil as in claim 2 wherein a bight portion of said conductive element forms a surface coil loop for receiving MRI RF signals from the vertebral region of a human patient whereby the signal-to-noise ratio of received NMR RF signal responses is enhanced relative to similar RF surface coils formed of a conductive element having a substantially only flat surface.

7. An MRI RF surface coil for use in a magnetic resonance imaging system and including a conductive element having a flat cross-sectional portion of width W which extends about a generally planar loop of approximate radius 2W or less and parallel to said flat portion for receiving MRI RF signals from a human body whereby the signal-to-noise ratio of received NMR RF signal responses is enhanced relative to similar RF surface coils formed of a conductive element having a narrower dimension with respect to said loop radius.

8. An MRI RF surface coil
    for use in a magnetic resonance imaging system and including a conductive element having a flat cross-sectional portion of width W which extends about a generally planar loop of approximate radius 2W or less and parallel to said flat portion for receiving MRI RF signals from a human body whereby the signal-to-noise ratio of received NMR RF signal responses is enhanced relative to similar RF surface coils formed of a conductive element having a narrower dimension with respect to said loop radius;
    wherein said conductive element includes a turned lip portion at either side of said flat portion so as to define a shallow U-shaped cross-section having said flat portion as its bight.

9. An MRI RF surface coil as in claim 8 wherein turned lip portions extend about a 90° radius of approximately 0.3 inch.

10. An MRI RF coil for use in a magnetic resonance imaging system and including a single unitary conductor of cross-sectional dimension W extending about a loop of average radius on the order of 2W or less.

* * * * *